United States Patent
Oh (10) Patent No.: US 7,139,631 B2
(45) Date of Patent: Nov. 21, 2006

(54) METHOD AND SYSTEM TO COMPENSATE FOR SCANNER SYSTEM TIMING VARIABILITY IN A SEMICONDUCTOR WAFER FABRICATION SYSTEM

(75) Inventor: Hilario L. Oh, Rochester, MI (US)

(73) Assignee: ASML Holding N.V. (NL)

( * ) Notice: Subject to any disclaimer, the term of this patent is extended or adjusted under 35 U.S.C. 154(b) by 270 days.

(21) Appl. No.: 10/800,369

(22) Filed: Mar. 11, 2004

(65) Prior Publication Data

US 2004/0241933 A1    Dec. 2, 2004

Related U.S. Application Data

(60) Provisional application No. 60/454,386, filed on Mar. 12, 2003.

(51) Int. Cl.
   *G06F 19/00* (2006.01)

(52) U.S. Cl. .................. 700/121; 700/99; 700/112; 700/204

(58) Field of Classification Search ............... 700/121, 700/99, 112, 204, 247, 254, 258, 259; 414/937, 414/940
   See application file for complete search history.

(56) References Cited

U.S. PATENT DOCUMENTS

| | | | |
|---|---|---|---|
| 4,732,473 A * | 3/1988 | Bille et al. | 356/237.5 |
| 4,850,027 A * | 7/1989 | Kimmel | 382/303 |
| 5,455,894 A | 10/1995 | Conboy et al. | |
| 5,563,798 A * | 10/1996 | Berken et al. | 700/218 |
| 5,774,222 A * | 6/1998 | Maeda et al. | 356/394 |
| 5,801,824 A * | 9/1998 | Henley | 356/237.2 |
| 5,818,576 A * | 10/1998 | Morishige et al. | 356/237.2 |
| 6,020,957 A * | 2/2000 | Rosengaus et al. | 356/237.4 |
| 6,308,107 B1 | 10/2001 | Conboy et al. | |
| 6,707,545 B1 * | 3/2004 | Hunter | 356/237.5 |
| 2003/0045131 A1 | 3/2003 | Verbeke et al. | |

FOREIGN PATENT DOCUMENTS

WO    WO 02/29885 A2    4/2002

* cited by examiner

*Primary Examiner*—Thomas Pham
(74) *Attorney, Agent, or Firm*—Blakely, Sokoloff, Taylor & Zafman LLP (57) ABSTRACT

A semiconductor wafer fabrication system that includes at least a track system and a scanner system compensates for deviations from nominal periodicity in the scanner system by dynamically introducing time delays when such deviations are detected. Preferably prior art static wait states are also introduced into the wafer recipe to reduce probability of resource conflicts. The resultant semiconductor wafer fabrication system can enjoy enhanced wafer throughput in that synchronization of wafer flow is maintained, despite such deviations.

20 Claims, 10 Drawing Sheets

| (1) | (2) | (3) | (4) | (5) | (6) | (7) | (8) | (9) | (10) | (11) | (12) | (13) |
|---|---|---|---|---|---|---|---|---|---|---|---|---|
| WAFER NO. | δ_EXPOSE | TIME | DELAY 1 | LPR | CP1x | WAIT 1 | DELAY 2 | CTR | BARCx | WAIT 2 | DELAY 3 | CTR |
| 1 | 1.54 | 0.00 | 0.00 | 7.00 | 24.00 | 20.00 | 0.00 | 7.00 | 44.00 | 33.50 | 0.00 | 5.50 |
| 2 | 0.00 | 40.00 | 0.00 | 7.00 | 24.00 | 20.00 | 0.00 | 7.00 | 44.00 | 33.50 | 0.00 | 5.50 |
| 3 | 1.86 | 80.00 | 0.00 | 7.00 | 24.00 | 20.00 | 0.00 | 7.00 | 44.00 | 33.50 | 0.00 | 5.50 |
| 4 | 2.98 | 120.00 | 0.00 | 7.00 | 24.00 | 20.00 | 0.00 | 7.00 | 44.00 | 33.50 | 0.00 | 5.50 |
| 5 | 3.39 | 160.00 | 0.00 | 7.00 | 24.00 | 20.00 | 0.00 | 7.00 | 44.00 | 33.50 | 0.00 | 5.50 |
| 6 | 1.64 | 200.00 | 0.00 | 7.00 | 24.00 | 20.00 | 0.00 | 7.00 | 44.00 | 33.50 | 0.00 | 5.50 |
| 7 | 1.71 | 240.00 | 0.00 | 7.00 | 24.00 | 20.00 | 0.00 | 7.00 | 44.00 | 33.50 | 0.00 | 5.50 |
| 8 | 1.90 | 280.00 | 0.00 | 7.00 | 24.00 | 20.00 | 0.00 | 7.00 | 44.00 | 33.50 | 0.00 | 5.50 |
| 9 | 3.16 | 320.00 | 0.00 | 7.00 | 24.00 | 20.00 | 0.00 | 7.00 | 44.00 | 33.50 | 0.00 | 5.50 |
| 10 | 2.45 | 360.00 | 0.00 | 7.00 | 24.00 | 20.00 | 0.00 | 7.00 | 44.00 | 33.50 | 0.00 | 5.50 |
| 11 | 2.76 | 400.00 | 0.00 | 7.00 | 24.00 | 20.00 | 0.00 | 7.00 | 44.00 | 33.50 | 0.00 | 5.50 |
| 12 | 1.95 | 440.00 | 0.00 | 7.00 | 24.00 | 20.00 | 0.00 | 7.00 | 44.00 | 33.50 | 0.00 | 5.50 |
| 13 | 1.82 | 480.00 | 0.00 | 7.00 | 24.00 | 20.00 | 0.00 | 7.00 | 44.00 | 33.50 | 0.00 | 5.50 |
| 14 | 3.20 | 520.00 | 0.00 | 7.00 | 24.00 | 20.00 | 0.00 | 7.00 | 44.00 | 33.50 | 0.00 | 5.50 |
| 15 | 2.92 | 560.00 | 0.00 | 7.00 | 24.00 | 20.00 | 0.00 | 7.00 | 44.00 | 33.50 | 0.00 | 5.50 |
| 16 | 2.14 | 600.00 | 0.00 | 7.00 | 24.00 | 20.00 | 0.00 | 7.00 | 44.00 | 33.50 | 0.00 | 5.50 |
| 17 | 1.77 | 640.00 | 0.00 | 7.00 | 24.00 | 20.00 | 0.00 | 7.00 | 44.00 | 33.50 | 0.00 | 5.50 |
| 18 | 3.18 | 680.00 | 0.00 | 7.00 | 24.00 | 20.00 | 0.00 | 7.00 | 44.00 | 33.50 | 0.00 | 5.50 |
| 19 | 1.23 | 720.00 | 0.00 | 7.00 | 24.00 | 20.00 | 0.00 | 7.00 | 44.00 | 33.50 | 0.00 | 5.50 |
| 20 | 4.14 | 760.00 | 0.00 | 7.00 | 24.00 | 20.00 | 0.00 | 7.00 | 44.00 | 33.50 | 1.54 | 5.50 |
| 21 | 3.14 | 800.00 | 0.00 | 7.00 | 24.00 | 20.00 | 0.00 | 7.00 | 44.00 | 33.50 | 1.54 | 5.50 |
| 22 | 3.22 | 840.00 | 0.00 | 7.00 | 24.00 | 20.00 | 1.54 | 7.00 | 44.00 | 33.50 | 1.86 | 5.50 |
| 23 | 1.91 | 880.00 | 1.54 | 7.00 | 24.00 | 20.00 | 0.00 | 7.00 | 44.00 | 33.50 | 4.84 | 5.50 |
| 24 | 1.53 | 921.54 | 0.00 | 7.00 | 24.00 | 20.00 | 1.86 | 7.00 | 44.00 | 33.50 | 6.37 | 5.50 |
| 25 | 0.00 | 961.54 | 1.86 | 7.00 | 24.00 | 20.00 | 2.98 | 7.00 | 44.00 | 33.50 | 5.03 | 5.50 |

FIG. 4A

| (14) | (15) | (16) | (17) | (18) | (19) | (20) | (21) | (22) | (23) | (24) | (25) | (26) |
|---|---|---|---|---|---|---|---|---|---|---|---|---|
| HP1x | WAIT 3 | LPR | CP4x | WAIT 4 | DELAY 4 | LPR | DELAY 5 | CP1x | WAIT 5 | DELAY 6 | CTR | CTx |
| 64.00 | 0.00 | 7.00 | 84.00 | 35.00 | 0.00 | 5.50 | 0.00 | 84.00 | 42.00 | 0.00 | 7.00 | 49.00 |
| 64.00 | 0.00 | 7.00 | 84.00 | 35.00 | 0.00 | 5.50 | 0.00 | 84.00 | 42.00 | 0.00 | 7.00 | 49.00 |
| 64.00 | 0.00 | 7.00 | 84.00 | 35.00 | 0.00 | 5.50 | 0.00 | 84.00 | 42.00 | 0.00 | 7.00 | 49.00 |
| 64.00 | 0.00 | 7.00 | 84.00 | 35.00 | 0.00 | 5.50 | 0.00 | 84.00 | 42.00 | 0.00 | 7.00 | 49.00 |
| 64.00 | 0.00 | 7.00 | 84.00 | 35.00 | 0.00 | 5.50 | 0.00 | 84.00 | 42.00 | 0.00 | 7.00 | 49.00 |
| 64.00 | 0.00 | 7.00 | 84.00 | 35.00 | 0.00 | 5.50 | 0.00 | 84.00 | 42.00 | 0.00 | 7.00 | 49.00 |
| 64.00 | 0.00 | 7.00 | 84.00 | 35.00 | 0.00 | 5.50 | 0.00 | 84.00 | 42.00 | 0.00 | 7.00 | 49.00 |
| 64.00 | 0.00 | 7.00 | 84.00 | 35.00 | 0.00 | 5.50 | 0.00 | 84.00 | 42.00 | 0.00 | 7.00 | 49.00 |
| 64.00 | 0.00 | 7.00 | 84.00 | 35.00 | 0.00 | 5.50 | 0.00 | 84.00 | 42.00 | 0.00 | 7.00 | 49.00 |
| 64.00 | 0.00 | 7.00 | 84.00 | 35.00 | 0.00 | 5.50 | 0.00 | 84.00 | 42.00 | 0.00 | 7.00 | 49.00 |
| 64.00 | 0.00 | 7.00 | 84.00 | 35.00 | 0.00 | 5.50 | 0.00 | 84.00 | 42.00 | 1.54 | 7.00 | 49.00 |
| 64.00 | 0.00 | 7.00 | 84.00 | 35.00 | 1.54 | 5.50 | 0.00 | 84.00 | 42.00 | 3.40 | 7.00 | 49.00 |
| 64.00 | 0.00 | 7.00 | 84.00 | 35.00 | 1.54 | 5.50 | 0.00 | 84.00 | 42.00 | 6.38 | 7.00 | 49.00 |
| 64.00 | 0.00 | 7.00 | 84.00 | 35.00 | 3.40 | 5.50 | 0.00 | 84.00 | 42.00 | 9.77 | 7.00 | 49.00 |
| 64.00 | 0.00 | 7.00 | 84.00 | 35.00 | 4.84 | 5.50 | 0.00 | 84.00 | 42.00 | 9.87 | 7.00 | 49.00 |
| 64.00 | 0.00 | 7.00 | 84.00 | 35.00 | 8.23 | 5.50 | 0.00 | 84.00 | 42.00 | 11.58 | 7.00 | 49.00 |
| 64.00 | 0.00 | 7.00 | 84.00 | 35.00 | 8.01 | 5.50 | 0.00 | 84.00 | 42.00 | 11.62 | 7.00 | 49.00 |
| 64.00 | 0.00 | 7.00 | 84.00 | 35.00 | 6.74 | 5.50 | 0.00 | 84.00 | 42.00 | 11.80 | 7.00 | 49.00 |
| 64.00 | 0.00 | 7.00 | 84.00 | 35.00 | 5.25 | 5.50 | 0.00 | 84.00 | 42.00 | 10.86 | 7.00 | 49.00 |
| 64.00 | 0.00 | 7.00 | 84.00 | 35.00 | 6.77 | 5.50 | 0.00 | 84.00 | 42.00 | 11.98 | 7.00 | 49.00 |
| 64.00 | 0.00 | 7.00 | 84.00 | 35.00 | | 5.50 | 0.00 | 84.00 | 42.00 | 12.23 | 7.00 | 49.00 |
| 64.00 | 0.00 | 7.00 | 84.00 | 35.00 | | 5.50 | 0.00 | 84.00 | 42.00 | 12.14 | 7.00 | 49.00 |
| 64.00 | 0.00 | 7.00 | 84.00 | 35.00 | | 5.50 | 0.00 | 84.00 | 42.00 | 12.18 | 7.00 | 49.00 |

FIG. 4B

| (27) | (28) | (29) | (30) | (31) | (32) | (33) | (34) | (35) | (36) | (37) | (38) | (39) |
|---|---|---|---|---|---|---|---|---|---|---|---|---|
| WAIT 6 | DELAY 7 | CTR | HP2x | WAIT 7 | SIR | CP2x | WAIT 8 | DELAY 8 | SIR | DELAY 9-10 | OEBRx | WAIT 9 |
| 28.50 | 0.00 | 5.50 | 94.00 | 0.00 | 7.00 | 64.00 | 13.50 | 0.00 | 5.50 | 0.00 | 34.00 | 5.00 |
| 28.50 | 0.00 | 5.50 | 94.00 | 0.00 | 7.00 | 64.00 | 13.50 | 0.00 | 5.50 | 0.00 | 34.00 | 5.00 |
| 28.50 | 0.00 | 5.50 | 94.00 | 0.00 | 7.00 | 64.00 | 13.50 | 0.00 | 5.50 | 0.00 | 34.00 | 5.00 |
| 28.50 | 0.00 | 5.50 | 94.00 | 0.00 | 7.00 | 64.00 | 13.50 | 0.00 | 5.50 | 1.54 | 34.00 | 5.00 |
| 28.50 | 0.00 | 5.50 | 94.00 | 0.00 | 7.00 | 64.00 | 13.50 | 0.00 | 5.50 | 1.54 | 34.00 | 5.00 |
| 28.50 | 0.00 | 5.50 | 94.00 | 0.00 | 7.00 | 64.00 | 13.50 | 0.00 | 5.50 | 3.40 | 34.00 | 5.00 |
| 28.50 | 0.00 | 5.50 | 94.00 | 0.00 | 7.00 | 64.00 | 13.50 | 1.54 | 5.50 | 4.84 | 34.00 | 5.00 |
| 28.50 | 1.54 | 5.50 | 94.00 | 0.00 | 7.00 | 64.00 | 13.50 | 1.54 | 5.50 | 8.23 | 34.00 | 5.00 |
| 28.50 | 1.54 | 5.50 | 94.00 | 0.00 | 7.00 | 64.00 | 13.50 | 1.86 | 5.50 | 8.01 | 34.00 | 5.00 |
| 28.50 | 1.86 | 5.50 | 94.00 | 0.00 | 7.00 | 64.00 | 13.50 | 4.84 | 5.50 | 6.74 | 34.00 | 5.00 |
| 28.50 | 4.84 | 5.50 | 94.00 | 0.00 | 7.00 | 64.00 | 13.50 | 6.37 | 5.50 | 5.25 | 34.00 | 5.00 |
| 28.50 | 6.37 | 5.50 | 94.00 | 0.00 | 7.00 | 64.00 | 13.50 | 5.03 | 5.50 | 6.77 | 34.00 | 5.00 |
| 28.50 | 5.03 | 5.50 | 94.00 | 0.00 | 7.00 | 64.00 | 13.50 | 3.35 | 5.50 | 7.51 | 34.00 | 5.00 |
| 28.50 | 3.35 | 5.50 | 94.00 | 0.00 | 7.00 | 64.00 | 13.50 | 3.61 | 5.50 | 8.37 | 34.00 | 5.00 |
| 28.50 | 3.61 | 5.50 | 94.00 | 0.00 | 7.00 | 64.00 | 13.50 | 5.06 | 5.50 | 7.16 | 34.00 | 5.00 |
| 28.50 | 5.06 | 5.50 | 94.00 | 0.00 | 7.00 | 64.00 | 13.50 | 5.61 | 5.50 | 6.54 | 34.00 | 5.00 |
| 28.50 | 5.61 | 5.50 | 94.00 | 0.00 | 7.00 | 64.00 | 13.50 | 5.21 | 5.50 | 6.97 | 34.00 | 5.00 |
| 28.50 | 5.21 | 5.50 | 94.00 | 0.00 | 7.00 | 64.00 | 13.50 | 4.72 | 5.50 | 7.94 | 34.00 | 5.00 |
| 28.50 | 4.72 | 5.50 | 94.00 | 0.00 | 7.00 | 64.00 | 13.50 | 3.77 | 5.50 | 8.26 | 34.00 | 5.00 |
| 28.50 | 3.77 | 5.50 | 94.00 | 0.00 | 7.00 | 64.00 | 13.50 | 5.02 | 5.50 | 6.83 | 34.00 | 5.00 |
| 28.50 | 5.02 | 5.50 | 94.00 | 0.00 | 7.00 | 64.00 | 13.50 | 6.11 | 5.50 | 7.10 | 34.00 | 5.00 |
| 28.50 | 6.11 | 5.50 | 94.00 | 0.00 | 7.00 | 64.00 | 13.50 | 5.06 | 5.50 | 6.19 | 34.00 | 5.00 |
| 28.50 | 5.06 | 5.50 | 94.00 | 0.00 | 7.00 | 45.12 | 13.50 | 3.91 | 5.50 | 0.36 | 34.00 | 1.94 |
| | | | | | 7.00 | | 0.00 | 0.00 | 0.00 | 0.00 | 0.00 | 0.00 |

FIG. 4C

| DELAY 11 (40) | SIR (41) | IN-PED (42) | WAIT 10 (43) | WHR (44) | ALIGN (45) | WAIT 11 (46) | DELAY 12 (47) | DIR (48) | DELAY 13 (49) | EXPOSE (50) | WAIT 12 (51) | DIR (52) |
|---|---|---|---|---|---|---|---|---|---|---|---|---|
| 0.00 | 8.00 | 0.00 | 0.00 | 12.50 | 19.30 | 25.00 | 0.00 | 6.50 | 1.54 | 33.50 | 0.00 | 6.50 |
| 0.00 | 8.00 | 0.00 | 0.00 | 12.50 | 19.30 | 25.00 | 1.54 | 6.50 | 0.00 | 33.50 | 0.00 | 6.50 |
| 0.00 | 8.00 | 1.54 | 0.00 | 12.50 | 19.30 | 25.00 | 0.00 | 6.50 | 1.86 | 33.50 | 0.00 | 6.50 |
| 1.54 | 8.00 | 0.00 | 0.00 | 12.50 | 19.30 | 25.00 | 1.86 | 6.50 | 2.98 | 33.50 | 0.00 | 6.50 |
| 0.00 | 8.00 | 1.86 | 0.00 | 12.50 | 19.30 | 25.00 | 2.98 | 6.50 | 3.39 | 33.50 | 0.00 | 6.50 |
| 1.86 | 8.00 | 2.98 | 0.00 | 12.50 | 19.30 | 25.00 | 3.39 | 6.50 | 1.64 | 33.50 | 0.00 | 6.50 |
| 2.98 | 8.00 | 3.39 | 0.00 | 12.50 | 19.30 | 25.00 | 1.64 | 6.50 | 1.71 | 33.50 | 0.00 | 6.50 |
| 3.39 | 8.00 | 1.64 | 0.00 | 12.50 | 19.30 | 25.00 | 1.71 | 6.50 | 1.90 | 33.50 | 0.00 | 6.50 |
| 1.64 | 8.00 | 1.71 | 0.00 | 12.50 | 19.30 | 25.00 | 1.90 | 6.50 | 3.16 | 33.50 | 0.00 | 6.50 |
| 1.71 | 8.00 | 1.90 | 0.00 | 12.50 | 19.30 | 25.00 | 3.16 | 6.50 | 2.45 | 33.50 | 0.00 | 6.50 |
| 1.90 | 8.00 | 3.16 | 0.00 | 12.50 | 19.30 | 25.00 | 2.45 | 6.50 | 2.76 | 33.50 | 0.00 | 6.50 |
| 3.16 | 8.00 | 2.45 | 0.00 | 12.50 | 19.30 | 25.00 | 2.76 | 6.50 | 1.95 | 33.50 | 0.00 | 6.50 |
| 2.45 | 8.00 | 2.76 | 0.00 | 12.50 | 19.30 | 25.00 | 1.95 | 6.50 | 1.82 | 33.50 | 0.00 | 6.50 |
| 2.76 | 8.00 | 1.95 | 0.00 | 12.50 | 19.30 | 25.00 | 1.82 | 6.50 | 3.20 | 33.50 | 0.00 | 6.50 |
| 1.95 | 8.00 | 1.82 | 0.00 | 12.50 | 19.30 | 25.00 | 3.20 | 6.50 | 2.92 | 33.50 | 0.00 | 6.50 |
| 1.82 | 8.00 | 3.20 | 0.00 | 12.50 | 19.30 | 25.00 | 2.92 | 6.50 | 2.14 | 33.50 | 0.00 | 6.50 |
| 3.20 | 8.00 | 2.92 | 0.00 | 12.50 | 19.30 | 25.00 | 2.14 | 6.50 | 1.77 | 33.50 | 0.00 | 6.50 |
| 2.92 | 8.00 | 2.14 | 0.00 | 12.50 | 19.30 | 25.00 | 1.77 | 6.50 | 3.18 | 33.50 | 0.00 | 6.50 |
| 2.14 | 8.00 | 1.77 | 0.00 | 12.50 | 19.30 | 25.00 | 3.18 | 6.50 | 1.23 | 33.50 | 0.00 | 6.50 |
| 1.77 | 8.00 | 3.18 | 0.00 | 12.50 | 19.30 | 25.00 | 1.23 | 6.50 | 4.14 | 33.50 | 0.00 | 6.50 |
| 3.18 | 8.00 | 1.23 | 0.00 | 12.50 | 19.30 | 25.00 | 4.14 | 6.50 | 1.50 | 33.50 | 0.00 | 6.50 |
| 1.23 | 8.00 | 4.14 | 0.00 | 12.50 | 12.30 | 25.00 | 0.00 | 6.50 | 0.00 | 33.50 | 0.00 | 6.50 |
| 0.00 | 0.00 | 0.00 | 0.00 | 0.00 | 0.00 | 0.00 | 0.00 | 0.00 | 0.00 | 0.00 | 0.00 | 0.00 |
| 0.00 | 0.00 | 0.00 | 0.00 | 0.00 | 0.00 | 0.00 | 0.00 | 0.00 | 0.00 | 0.00 | 0.00 | 0.00 |

FIG. 4D

| (53) DISCHRG | (54) WAIT 13 | (55) WHR | (56) OUT-PED | (57) WAIT 14 | (58) DELAY 17 | (59) SIR | (60) HP3x | (61) WAIT 15 | (62) DVR | (63) CP3x | (64) WAIT 16 | (65) DELAY 19 |
|---|---|---|---|---|---|---|---|---|---|---|---|---|
| 1.00 | 0.00 | 12.40 | 1.00 | 0.00 | 0.00 | 9.50 | 94.00 | 0.00 | 7.00 | 64.00 | 13.50 | 1.86 |
| 1.00 | 0.00 | 12.40 | 1.00 | 0.00 | 0.00 | 9.50 | 94.00 | 0.00 | 7.00 | 64.00 | 13.50 | 4.84 |
| 1.00 | 0.00 | 12.40 | 1.00 | 0.00 | 0.00 | 9.50 | 94.00 | 0.00 | 7.00 | 64.00 | 13.50 | 6.37 |
| 1.00 | 0.00 | 12.40 | 1.00 | 0.00 | 0.00 | 9.50 | 94.00 | 0.00 | 7.00 | 64.00 | 13.50 | 5.03 |
| 1.00 | 0.00 | 12.40 | 1.00 | 0.00 | 0.00 | 9.50 | 94.00 | 0.00 | 7.00 | 64.00 | 13.50 | 3.35 |
| 1.00 | 0.00 | 12.40 | 1.00 | 0.00 | 0.00 | 9.50 | 94.00 | 0.00 | 7.00 | 64.00 | 13.50 | 3.61 |
| 1.00 | 0.00 | 12.40 | 1.00 | 0.00 | 0.00 | 9.50 | 94.00 | 0.00 | 7.00 | 64.00 | 13.50 | 5.06 |
| 1.00 | 0.00 | 12.40 | 1.00 | 0.00 | 0.00 | 9.50 | 94.00 | 0.00 | 7.00 | 64.00 | 13.50 | 5.61 |
| 1.00 | 0.00 | 12.40 | 1.00 | 0.00 | 0.00 | 9.50 | 94.00 | 0.00 | 7.00 | 64.00 | 13.50 | 5.21 |
| 1.00 | 0.00 | 12.40 | 1.00 | 0.00 | 0.00 | 9.50 | 94.00 | 0.00 | 7.00 | 64.00 | 13.50 | 4.72 |
| 1.00 | 0.00 | 12.40 | 1.00 | 0.00 | 0.00 | 9.50 | 94.00 | 0.00 | 7.00 | 64.00 | 13.50 | 3.77 |
| 1.00 | 0.00 | 12.40 | 1.00 | 0.00 | 0.00 | 9.50 | 94.00 | 0.00 | 7.00 | 64.00 | 13.50 | 5.02 |
| 1.00 | 0.00 | 12.40 | 1.00 | 0.00 | 0.00 | 9.50 | 94.00 | 0.00 | 7.00 | 64.00 | 13.50 | 6.11 |
| 1.00 | 0.00 | 12.40 | 1.00 | 0.00 | 0.00 | 9.50 | 94.00 | 0.00 | 7.00 | 64.00 | 13.50 | 5.06 |
| 1.00 | 0.00 | 12.40 | 1.00 | 0.00 | 0.00 | 9.50 | 94.00 | 0.00 | 7.00 | 64.00 | 13.50 | 3.91 |
| 1.00 | 0.00 | 0.50 | 0.00 | 0.00 | 0.00 | 9.50 | 62.97 | 0.00 | 7.00 | 46.92 | 0.00 | 0.00 |
| 1.00 | 0.00 | 0.00 | 0.00 | 0.00 | 0.00 | 9.50 | 21.74 | 0.00 | 7.00 | 5.16 | 0.00 | 0.00 |
| 0.00 | 0.00 | 0.00 | 0.00 | 0.00 | 0.00 | 0.00 | 0.00 | 0.00 | 0.00 | 0.00 | 0.00 | 0.00 |
| 0.00 | 0.00 | 0.00 | 0.00 | 0.00 | 0.00 | 0.00 | 0.00 | 0.00 | 0.00 | 0.00 | 0.00 | 0.00 |
| 0.00 | 0.00 | 0.00 | 0.00 | 0.00 | 0.00 | 0.00 | 0.00 | 0.00 | 0.00 | 0.00 | 0.00 | 0.00 |
| 0.00 | 0.00 | 0.00 | 0.00 | 0.00 | 0.00 | 0.00 | 0.00 | 0.00 | 0.00 | 0.00 | 0.00 | 0.00 |

FIG. 4E

| DVR (66) | DEVx (67) | WAIT 17 (68) | DELAY 20 (69) | DVR (70) | CP4x (71) | WAIT 18 (72) | DELAY 21 (73) | LPR (74) | LPx (75) |
|---|---|---|---|---|---|---|---|---|---|
| 5.50 | 89.00 | 30.00 | 8.01 | 5.50 | 5.00 | 31.00 | 1.71 | 7.00 | 0.00 |
| 5.50 | 89.00 | 30.00 | 6.74 | 5.50 | 5.00 | 31.00 | 1.90 | 7.00 | 0.00 |
| 5.50 | 89.00 | 30.00 | 5.25 | 5.50 | 5.00 | 31.00 | 3.16 | 7.00 | 0.00 |
| 5.50 | 89.00 | 30.00 | 6.77 | 5.50 | 5.00 | 31.00 | 2.45 | 7.00 | 0.00 |
| 5.50 | 89.00 | 30.00 | 7.51 | 5.50 | 5.00 | 31.00 | 2.76 | 7.00 | 0.00 |
| 5.50 | 89.00 | 30.00 | 8.37 | 5.50 | 5.00 | 31.00 | 1.95 | 7.00 | 0.00 |
| 5.50 | 89.00 | 30.00 | 7.16 | 5.50 | 5.00 | 31.00 | 1.82 | 7.00 | 0.00 |
| 5.50 | 89.00 | 30.00 | 6.54 | 5.50 | 5.00 | 31.00 | 3.20 | 7.00 | 0.00 |
| 5.50 | 89.00 | 30.00 | 6.97 | 5.50 | 5.00 | 31.00 | 2.92 | 7.00 | 0.00 |
| 5.50 | 89.00 | 30.00 | 7.94 | 5.50 | 5.00 | 31.00 | 2.14 | 7.00 | 0.00 |
| 5.50 | 89.00 | 30.00 | 8.26 | 5.50 | 5.00 | 31.00 | 1.77 | 7.00 | 0.00 |
| 5.50 | 89.00 | 30.00 | 6.83 | 4.70 | 0.00 | 0.00 | 0.00 | 1.66 | 0.00 |
| 5.50 | 86.07 | 0.00 | 0.00 | 0.00 | 0.00 | 0.00 | 0.00 | 0.00 | 0.00 |
| 5.50 | 43.92 | 0.00 | 0.00 | 0.00 | 0.00 | 0.00 | 0.00 | 0.00 | 0.00 |
| 0.00 | 2.16 | 0.00 | 0.00 | 0.00 | 0.00 | 0.00 | 0.00 | 0.00 | 0.00 |
| 0.00 | 0.00 | 0.00 | 0.00 | 0.00 | 0.00 | 0.00 | 0.00 | 0.00 | 0.00 |
| 0.00 | 0.00 | 0.00 | 0.00 | 0.00 | 0.00 | 0.00 | 0.00 | 0.00 | 0.00 |
| 0.00 | 0.00 | 0.00 | 0.00 | 0.00 | 0.00 | 0.00 | 0.00 | 0.00 | 0.00 |
| 0.00 | 0.00 | 0.00 | 0.00 | 0.00 | 0.00 | 0.00 | 0.00 | 0.00 | 0.00 |
| 0.00 | 0.00 | 0.00 | 0.00 | 0.00 | 0.00 | 0.00 | 0.00 | 0.00 | 0.00 |
| 0.00 | 0.00 | 0.00 | 0.00 | 0.00 | 0.00 | 0.00 | 0.00 | 0.00 | 0.00 |

FIG. 4F

METHOD AND SYSTEM TO COMPENSATE FOR SCANNER SYSTEM TIMING VARIABILITY IN A SEMICONDUCTOR WAFER FABRICATION SYSTEM

This application claims the benefit of U.S. Provisional Application No. 60/454,386 filed Mar. 12, 2003 entitled METHOD AND SYSTEN TO COMPENSATE FOR SCANNER SYSTEM TIMING VARIABILITY IN A SEMICONDUCTOR WAFER FABRICATION SYSTEM.

FIELD OF THE INVENTION

The invention relates generally to semiconductor wafer fabrication systems that comprise a track system and a scanner system, and more specifically to compensating such wafer fabrication systems for deviations from nominal timing in the scanner system.

BACKGROUND OF THE INVENTION

Figure 1:
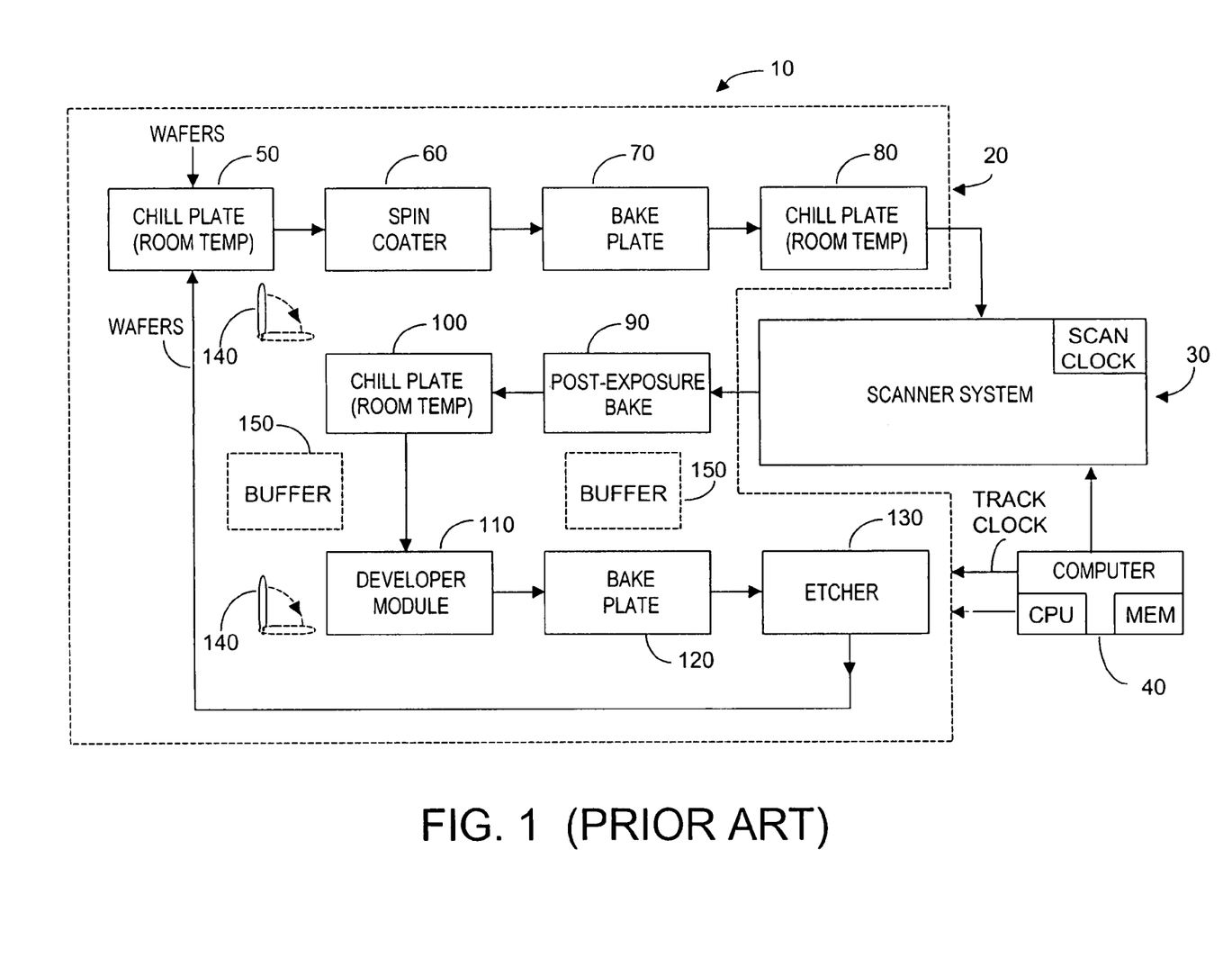
FIG. 1 is a block diagram showing exemplary modules or processes in a two-clock semiconductor wafer production system operating without scanner system timing compensation, according to the prior art.

Modern integrated circuits (ICs) are fabricated on semiconductor wafers that are mass produced in fabrication sites. The fabrications sites (or "fabs") employ various types of automatic equipment that must function to very exacting and carefully controlled operating parameters. FIG. 1 depicts some of the process steps or modules found in a generic fab system 10. System 10 may be thought of as a track system 20 that comprises a variety of production modules, and a scanner (or stepper) system 30. Track system 20 typically operates synchronously under control of a computer system 40 that, among other tasks, outputs a track system clock signal (TRACK CLOCK). By synchronously it is meant that wafers are moved in the track system 20 responsive to the track clock signal.

The wafers under production are made available for input to the scanner system 30 responsive to the track clock signal. However scanner system 30 receives the wafers and outputs scanner system-completed wafers responsive to its internal scanner system clock (SCANNER CLOCK). Understandably much attention is given in the prior art to trying to synchronize the track clock and the scanner clock to reduce dead-time in moving and processing wafers through the overall fabrication system. But to achieve good synchronization between the track clock and the scanner clock, the timing in the scanner system must exhibit a substantially consistent periodicity. But in practice, exposure procedures within the scanner system can exhibit,a timing deviation from nominal periodicity, which deviation or variability hampers clock synchronization.

Exemplary modules within track system 20 are shown in FIG. 1. At the upper left region of FIG. 1, a sequence of wafers are input to system 20. A chill plate module 50 typically is used to stabilize the wafer temperature by about 1° C. to room temperature before the wafers enter a spin coater 60 where a film of polymer photoresist is placed on the upper surface of the wafer. In some processes, at step 60 an anti-reflection coating may first be deposited upon the upper wafer surface and the wafer then baked (e.g., module or step 70) and then returned to the spin coater 60 for deposition of photo resist. As modern photolithography seeks to define smaller and smaller feature size using shorter wavelength light, ultraviolet reflectivity becomes a greater problem, and thus the use of anti-reflection layer(s).

Eventually the wafer is passed by a robotic unit 140 to a bake plate 70 where the film of photoresist is hardened and excess solvents are driven out of the wafer with heat. A subsequent chill plate process 80 cools the wafers to a stabilized room temperature. Upon receipt of a track clock signal issued by computer system 40, the wafer under process is then sent out of the thus-described portion of track system 20 and is available for input to the stepper/scanner system 30. Stepper/scanner system 30 will accept the wafer in question responsive to a signal from the scanner clock. Within system 30 various lithographic techniques may be carried out upon the wafer in question. At module or step 90, the wafer is subjected to a post-exposure bake (PEB), using a PEB bake plate, and then to a chill plate 100, that returns the wafer to a stabilized ambient room temperature. A developer module stage 110 typically follows, during which the latent lithographic image that was formed within the stepper/scanner module 30 is developed in the polymer film on the wafer upper surface. In a positive tone image, the portions of the photoresist exposed to light will become soluble and dissolve away in solution to expose desired regions of the wafer structure. A bake plate step 120 follows to dry and harden the wafer surface. An etcher module 130 then follows, and the thus-processed wafer is returned to a chill plate, e.g., module 50. Several of the steps or stages shown in FIG. 1 may be repeated for the same wafer dozens of time, depending upon the specifics of the processes involved (e.g., the "recipe". Typically devices shown generically as robotic arms 140 may be used to mechanically move wafers from one module to another.

In practice the rate at which track system 20 can send wafers for input to stepper/scanner system 30 may not coincide with the rate at which stepper/scanner system 30 is ready to receive ("R2R") new wafers. Similarly, the time when scanner system 30 is ready to send ("R2S") wafers back into track system 20 may not coincide with the moment at which track system 20 is ready to receive wafers for further processing. In some prior art systems 10, buffers such as 150 may be included to add time to processing of wafers within system 20. One or more buffers or buffer functions may be used in system 10 to absorb what would otherwise be disturbances to the time flow of wafers. A buffer may be a physical entity, for example a module used as a temporary storage site to hold excess wafers longer than needed for processing at that station, perhaps a dedicated buffer station, or a robotic arm temporarily used as a storage site for wafers.

By way of example, assume that responsive to timing of the track clock signal chill plate 80 is ready to send wafers into the stepper/scanner system 30 sooner than the stepper/scanner clock allows system 30 to be ready. When it is known that stepper/scanner system 30 is ready to receive wafers, the robotic arm 140 can load wafers into system 30, taking them if necessary from a buffer 150.

Understandably having to provide extra robotic arms and/or buffers to try to improve the output timing of track system 20 is not an optimum solution to the problem of enabling a better timing match between system 20 and system 30. There can be time conflicts within system 10 between modules competing for access to a given module, and it can be necessary to try to force time matching between wafers sent out of system 20, and wafers received into system 30, and then wafers exiting system 30 back into track system 20. But providing buffers 150 and/or additional robotic type mechanisms 140 to try to smooth out system flow requires additional cost and additional floor space within the fab, and will actually reduce wafer throughput.

One prior art solution to helping resolve resource conflicts within track system 20 is described in U.S. Pat. No. 6,418,356 (July 2002) to H. Oh, inventor herein. In the '356 patent, conflicts for transportation resources (e.g., robotic mechanism) are resolved by selectively adding "wait" time to modules that can tolerate such wait states without substantially degrading on-wafer production results associated with track system 20. Applicant incorporates herein by reference U.S. Pat. No. 6,418,356.

But even if track system resource conflicts can be resolved, deviations from nominal timing in the associated scanner system can degrade overall fabrication system performance. What is needed is a method of compensating for such scanner system timing deviations such that the timing match between the ready to send (R2S) state of the track system and the ready to receive (R2R) state of the stepper/scanner lithographic system is maintained.

The present invention provides such compensation for time deviations in a scanner system.

SUMMARY OF THE PRESENT INVENTION

The present invention operates a semiconductor wafer fabrication system that includes a track system and a scanner system such that deviations from anticipated nominal timing in the scanner system are compensated for. Such time deviations typically arise from variations in scanner system exposure times. The present invention detects such scanner system time deviations and dynamically inserts additional time "delays" into the wafer production system to help compensate therefor, and to thus preserve good synchronization of wafer flow across the track system to scanner system interface.

These dynamically inserted delays are in addition to pre-planned "waits" that are added into the wafer production recipe at non-critical module phases of the process, as disclosed in U.S. Pat. No. 6,418,356. The resultant semiconductor wafer fabrication system can maintain a synchronized wafer flow, and thus achieve improved throughput. Other features and advantages of the invention will appear from the following description in which the preferred embodiments have been set forth in detail, in conjunction with their accompanying drawings.

BRIEF DESCRIPTION OF THE DRAWINGS

FIG. 3, comprising FIG. 4, comprising

DETAILED DESCRIPTION OF THE PREFERRED EMBODIMENT

Figure 2:
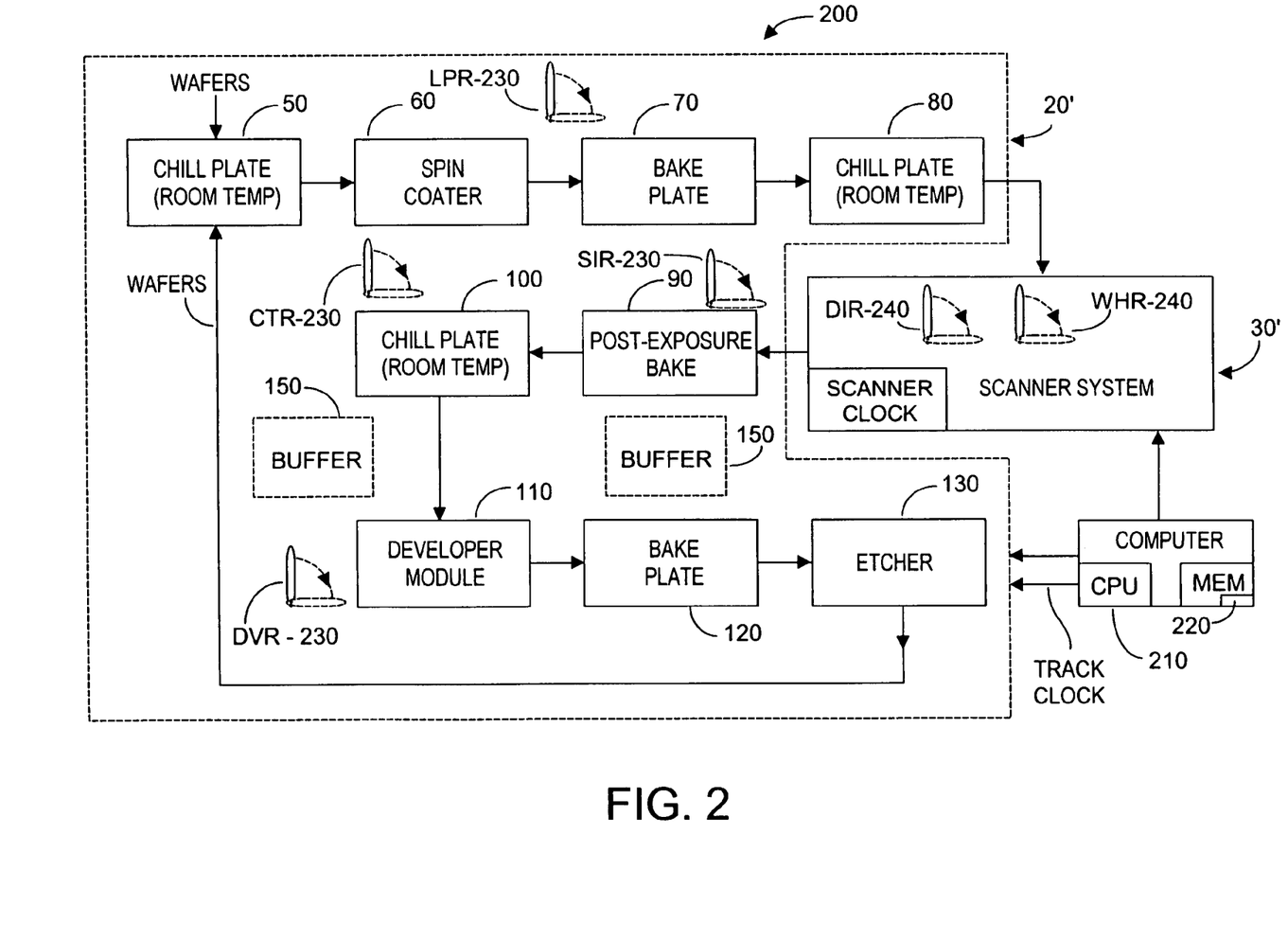
FIG. 2 is a block diagram showing exemplary modules or processes in a semiconductor wafer production system with scanner system timing compensation, according to the present invention.

FIG. 2 is a block diagram of a semiconductor wafer production system 200 that includes a track system 20' and a scanner system 30'. Systems 20' and 30' may be the same as systems 20 and 30 in FIG. 1, or may include different and/or different numbers of modules and more or less robotic units.

It may be assumed that system 200 has track system 20' compensation in the form of inserted "wait" times as described in U.S. Pat. No. 6,418,356. However in contrast to what is described in the '356 patent, track system 20' advantageously also has compensation against deviations from nominal scanner system timing, which is to say, deviations from nominal scanner system clock periodicity. Such compensation is in the form of inserted time "delays".

System 200 preferably operates under control of computer system 210 whose computer readable memory stores (or can be loaded with) software 220 that when executed by the computer CPU implements the above system operation. Computer system 210 can readily compare actual scanner system 30' clock timing against a nominal clock timing to detect deviations in periodicity from nominal. When such timing deviations are detected, software 210 upon CPU execution causes the insertion into track system 20' of appropriate time "delays" (as contrasted with the insertion of '356 patent pre-planned "waits", which are introduced into the wafer production recipe even before system 200 is turned-on). As described herein, such inserted "delays" improve the match between timing of wafers sent by track system 20' and timing of wafers received by scanner system 30', e.g., wafers sent from chill plate 80 into scanner system 30', as well as wafers sent from scanner system 30' into post-exposure bake module 90 in track system 20', in exemplary FIG. 2.

Track system 20' is shown with four robotic stations: LRP-230 (or "LPR") is a load port robotic unit associated with loading wafers into/out of system 200, CTR-230 (or "CTR") is a robotic unit associated with coater module 60, SIR-230 (or "SIR") is a robot associated loading wafers into and out of scanner system 30', and DVR-230 (or "DVR"), a robot associated generally with developer module 110. All four robotic units LRP, CTR, SIR, and DVR preferably have two arms, such as robotic units developed by assignee ASML, Inc. While system 200 will be described with reference to these four robotic stations, it is understood that the present invention may be practiced with wafer production systems employing fewer or more than four track system robotic stations, or with systems not employing any dual-armed robotic stations.

Table 1 below will now be described with reference to the present invention. In Table 1, rows 11–15 (shown with shading) denote process steps associated with scanner system 30'; the remaining process steps are associated with track system 20'. Nominally a period of 40.0 seconds is assumed for the wafer recipe given in Table 1, e.g., in the nominal case a new wafer enters the system for processing every 40 seconds.

TABLE 1

| Process Step | Robot Assignment | | Process | | |
| --- | --- | --- | --- | --- | --- |
| | Pick By: | Move Type | Transport Time | +OH Time | Planned Wait |
| LPx | LPR | Sngl | 7.0 | 0.00 | 0.00 |
| CP1x | CTR | Sngl | 7.0 | 24.00 | 20.00 |
| BARCx | CTR | Swap | 5.5 | 44.00 | 33.50 |
| HP1x | LPR | Sngl | 7.0 | 64.00 | 0.00 |
| CP4x | LPR | Swap | 5.5 | 84.00 | 35.00 |
| CP1x | CTR | Sngl | 7.0 | 84.00 | 42.00 |
| CTx | CTR | Swap | 5.5 | 49.00 | 28.50 |
| HP2x | SIR | Sngl | 7.0 | 94.00 | 0.00 |
| CP2x | SIR | Swap | 5.5 | 64.00 | 13.50 |
| OEBRx | SIR | Swap | 8.0 | 34.00 | 5.00 |

TABLE 1-continued

| Process Step | Robot Assignment | | Process | | |
|---|---|---|---|---|---|
| | Pick By: | Move Type | Transport Time | +OH Time | Planned Wait |
| ▒IN-PED▒ | ▒WHR▒ | ▒Sngl▒ | ▒12.5▒ | ▒1.00▒ | ▒0.00▒ |
| ▒ALIGN▒ | ▒DIR▒ | ▒Sngl▒ | ▒6.5▒ | ▒19.30▒ | ▒25.00▒ |
| ▒EXPOSE▒ | ▒DIR▒ | ▒Swap▒ | ▒6.5▒ | ▒33.50▒ | ▒0.00▒ |
| ▒DISCHRG▒ | ▒WHR▒ | ▒Sngl▒ | ▒12.4▒ | ▒1.00▒ | ▒0.00▒ |
| ▒OUT-PED▒ | ▒SIR▒ | ▒SWAP▒ | ▒9.5▒ | ▒1.00▒ | ▒0.00▒ |
| HP3x | DVR | Sngl | 7.0 | 94.00 | 0.00 |
| CP3x | DVR | Swap | 5.5 | 64.00 | 13.50 |
| DEVx | DVR | Swap | 5.5 | 89.00 | 30.00 |
| CP4x | LPR | Sngl | 7.0 | 5.00 | 31.00 |
| LPx | | | 0.0 | 0.00 | 0.00 |

Referring to Table 1, the first column denotes process steps, and the fifth column denotes the process and overhead (OH) time corresponding to the process step. By way of example, in a chill plate operation (e.g., CP1x), the overhead time refers to the time necessary to open and close the chill plate chamber module, whereas the process time represents the actual duration of a timed-chill within the closed chill plate chamber.

Thus in Table 1, the first column represents modules for the process steps, where LPx denotes load port, CP1x, CP2x, CP3x denote chill plates (e.g., perhaps chill plates 50, 80, 100 in FIG. 2), BARCx denotes bottom anti-reflection coating module (e.g., a step carried out by spin coater module 60), HP1x, HP2x, HP3x, HP4x denote hot or bake plates (e.g., bake plates 70, 90, 120 in FIG. 2), CTx denotes a coater module (e.g., module 60 in FIG. 2), OEBRX denotes removal of the bead formed on the outer edge of a wafer. IN-PED and OUT-PED denote input and output pedestals within scanner system 30', ALIGN denotes wafer alignment within scanner system 30', EXPOSE refers to wafer exposure within scanner system 30, and DISCHARGE refers to a discharge chute within scanner system 30'. The five rows of data in Table 1 relating to scanner system 30' are shown with background shading and dark borders; the remaining rows of data represent steps in track system 20'.

Columns two and three in Table 1 denote robot assignments in the exemplary embodiment to be described and robotic movements. LPR denotes load port robot (e.g., LPR-230 in FIG. 2), CTR denotes coater robot (e.g., CTR-230 in FIG. 2), SIR denotes a stepper interface robot (e.g., SIR-230 in FIG. 2), WHR and DIR denote a wafer handling robots associated with scanner system 30' (e.g., WHR-240, DHR-240 in FIG. 2). In a so-called single movement, a generic robot that must move a wafer from a first process module to a following second process module must first remove the wafer already in the second process module before relocating the first wafer to the second process module. In a swap movement, a two-armed robotic mechanism is used in which the first robot arm can pick up a first wafer from a first module, and a second wafer from a second module, and then use the first arm to position the first wafer in the second module. Where feasible, swap movements are preferred to single movements.

For example, looking left-to-right at row 1 in Table 1, in a load port process step, a wafer is picked-up by an LPR robotic mechanism (e.g., LPR-230) from the load port LPx and is placed at a following process module, chill plate CP1x (perhaps module 50 in FIG. 2). Transport time associated with picking-up and placing as shown in column 4 is 7.0 seconds. At row 2, a chill plate process step occurs for which the sum of process and overhead time is 24.0 seconds.

In the last column of row 2, a 20 second pre-planned wait time is added to the wafer process and overhead time, as described in U.S. Pat. No. 6,418,356.

The pre-planned wait times shown in the last column of Table 1 are determined and added to the wafer recipe process times before wafer production system 200 is even turned on. These are times added to non-critical module stages as described in the '356 patent to help resolve resource conflicts within track system 20'. These prior art "waits" are to be distinguished from "delays" that are added, as needed, during actual operation of wafer production system 200 to compensate for deviations from nominal periodicity within scanner system 30', according to the present invention.

After the expiration of the process, overhead and pre-planned wait time at process module XP1x, a robotic mechanism CTR-230 takes 7.0 seconds to transport the wafer to the next process step, namely BARCx in row 3 of Table 1.

In row 3, a process and overhead time of 44.0 second is used for removal of the bead from the wafer circumferences, with a pre-planned wait of 33.5 seconds appended, according to the '356 patent. It is seen that a wafer swap robotic movement occurs in which 5.5 second transport time is used to move the wafer to the next process step, namely baking the wafer at hot plate HP1x in row 4 of Table 1.

Jumping down to shaded-rows 11–15, which involve process steps and robotic movements inside scanner system 30', an IN-PED step involves robotic mechanism SIR-230 placing a wafer on an input pedestal (IN-PED), the wafer having thus entered scanner system 30'. As indicated in Table 1, a wafer-handling robot (e.g, WHR-240) is then used to transport the wafer to the aligner stage (ALIGN), see exemplary system 200 shown in FIG. 2, and Table 1, row 12. Transport time is 12.5 seconds with 1.0 second process plus overhead time. Zero planned wait is required. At row 12 in Table 1, the wafer now undergoes an alignment step that involves 19.30 seconds process plus overhead time, with 25.0 seconds pre-planned. The alignment takes place at a stage that is part of the DIR-240 robotic mechanism.

At the expiration of the alignment, overhead, and pre-planned wait time, the wafer in question now undergoes an exposure step that involves simply rotating the DIR-240 robot. Movement is such that one arm of the DIR-240 robotic unit holding an aligned wafer is rotated or moved into position to expose that wafer, while the other arm is free to move another wafer into the pre-alignment step. Table 1 indicates that the rotation takes 6.5 seconds transport time, while 33.5 seconds are exposure plus overhead time, and zero seconds wait.

In the next row of Table 1, the WHR-240 robotic mechanism discharges the wafer from the exposure stage within scanner system 30' in 12.4 seconds with 1.0 seconds process and overhead time, and zero seconds wait. In row 15 of Table 1 (the last row directed to scanner system 30' per se) the SIR-230 robotic mechanism picks the wafer in question from the out pedestal (OUT-PED) associated with scanner system 30'. This maneuver takes nominally 9.5 seconds transport time with 1.0 seconds process and overhead time, with zero seconds wait. The wafer has now completed processing within scanner system 30' and re-enters track system 20' as indicated in exemplary FIG. 2, for example beginning with a post-exposure bake step 90 (denoted as HP-3x in row 16 of Table 1).

Referring to Table 1, row 16, the wafer at hot plate HP3x undergoes 94.0 seconds of process plus overhead time in baking. DVR robotic mechanism 230 then picks and transports the wafer to chill plate CP3x in 7 seconds. The wafer then undergoes a chill plate process step, perhaps chill plate 100 in FIG. 2, denoted CP3x in Table 1. After 64.0 seconds of chill time plus overhead time, robotic mechanism DVR-230 requires 5.5 seconds to transport the wafer to the developer module (see Table 1, row 18).

As shown in FIG. 2, typically the wafer next undergoes a developer step 110, denoted DEVx in Table 1, involving an 89.0 second process plus overhead time. In Table 1 the following step is another chill plate (CP4x), perhaps chill plate 50 in FIG. 2, after which the wafer exits track system 20' via a load port (denoted LPx in Table 1). It is understood that FIG. 2 and Table 1 are exemplary and indeed every step shown in FIG. 2 may not be reflected in Table 1.

Figure 3A:
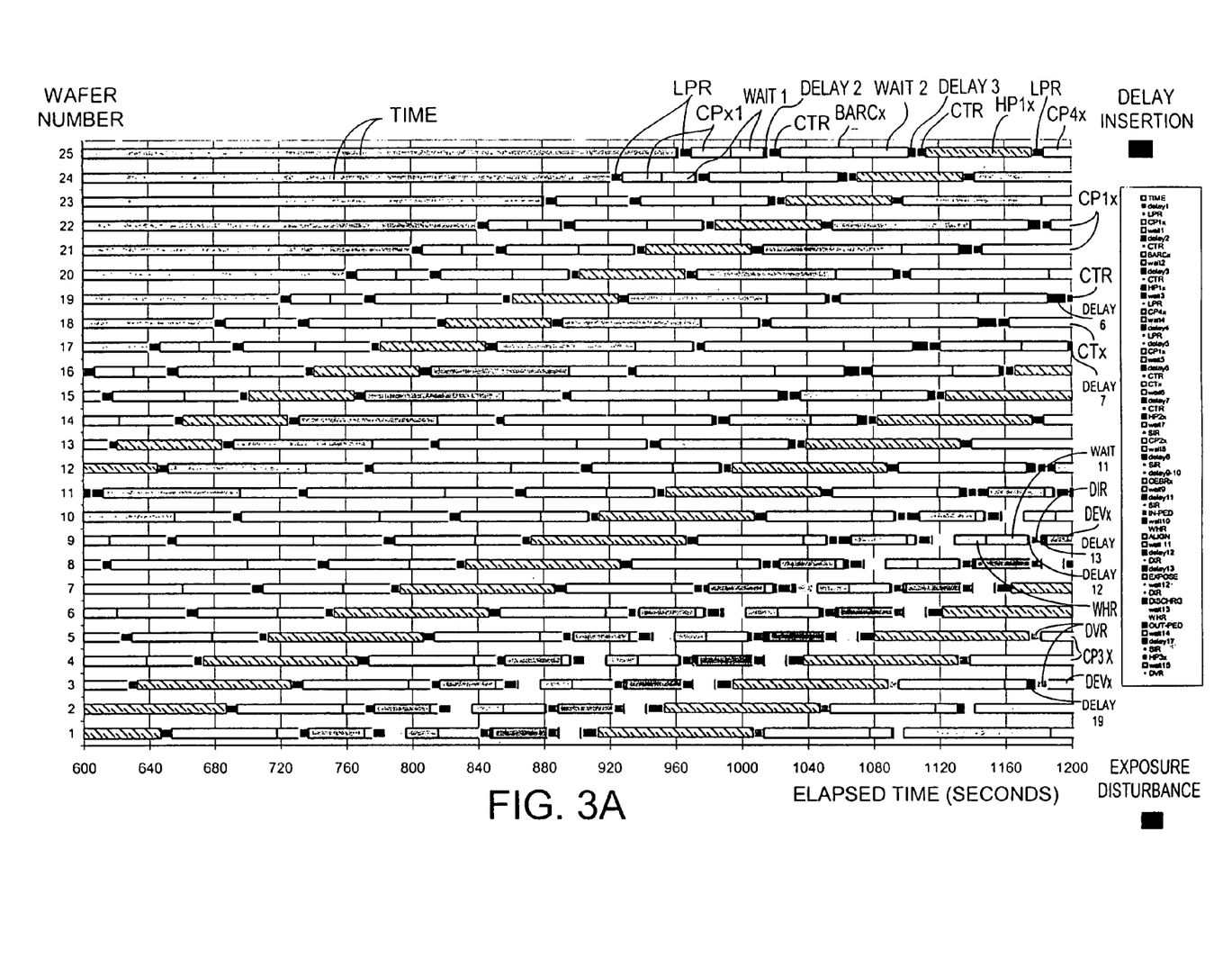
FIGS. 3A and 3B, is a flow chart depicting the process flow for twenty-five wafers produced according to the exemplary recipe of Table 1, according to the present invention.
Figure 3B:
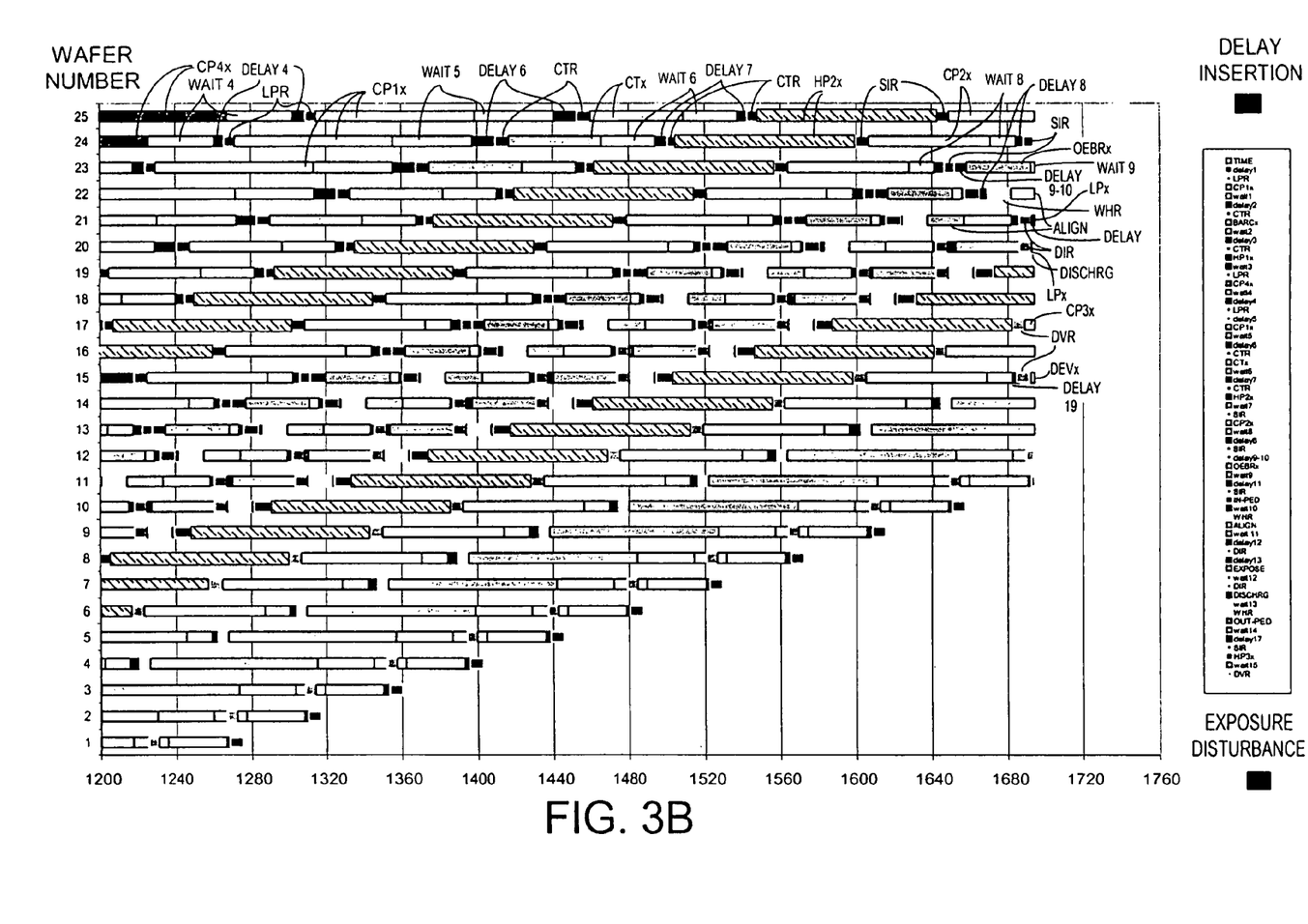

FIG. 3 comprises FIG. 3A and FIG. 3B, the latter being a continuation of FIG. 3A. FIGS. 3A and 3B graphically depict twenty-five wafers, denoted in the vertical axis as wafer number 1, . . . 25, as the wafers undergo processing in system 200 as a function of elapsed time, shown on the horizontal axis. To reiterate, in the system described in U.S. Pat. No. 6,418,356, incorporated hereby by reference, various "wait" times were added to non-critical processes to avoid conflicts by different wafers for a common system resource, these waits being denoted as "planned waits" in the last column of Table 1. In FIGS. 3A and 3B, such waits are shown as white bars, and are calculated for system 200' in FIG. 2 per the '356 patent. The legend of symbols on the right-hand portion of FIGS. 3A and 3B identifies what the various rectangular and square-like symbols in FIGS. 3A and 3B denote. Further, various exemplary regions of FIGS. 3A and 3B are explicitly called out with identifying indicia at the top portions of FIGS. 3A and 3B.

FIG. 4, comprising FIGS. 4A–4F, is a spreadsheet showing the fabrication recipe for the twenty-five wafers in question. FIGS. 3A and 3B graphically depict the data calculated and enumerated in detail in FIGS. 4A–4F. As described herein, the various "wait" times shown in FIGS. 4A–4F and depicted in FIGS. 3A and 3B as white rectangles are wait times as described in the '356 patent, and are planned "waits" that are added to non-critical module stages to reduce problems associated with resource conflicts. By contrast, the various inserted "delay" times shown in FIGS. 4A–4F and depicted as black rectangles in FIGS. 3A and 3B are time "delays" inserted according to the present invention to compensate for deviations from nominal timing (e.g., variability in scanner clock periodicity) in scanner system 30'. These delays are added into system 200, depicted in FIG. 2.

Figure 4A:
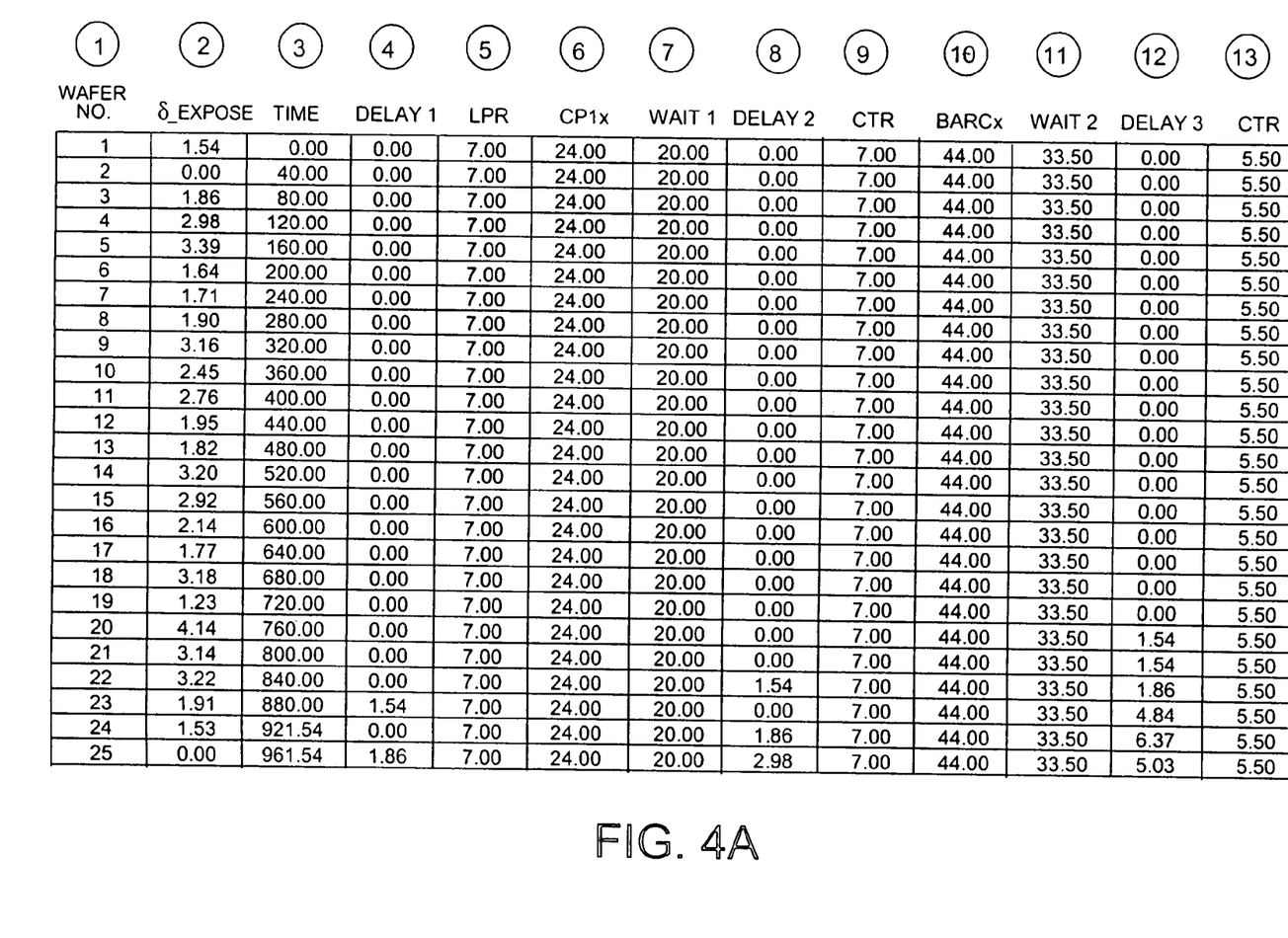
FIGS. 4A–4F, is a spreadsheet depicting data for the wafer flow shown in FIGS. 3A and 3B, according to the present invention.

In FIG. 4A, column 1 denotes wafer number (data for 25 wafers being shown in the column), and column 2 represents deviations (in seconds) from nominal 40.0 second timing or periodicity for scanner system 30', in the example being described. It is these scanner system 30' deviations that are compensated for with inserted "delays", according to the present invention. The insertion of such "delays" advantageously helps to promote a better timing match between when track system 20' is ready to send a wafer into scanner system 30', and when scanner system 30' is ready to receive such a wafer, as well as when scanner system 30' is ready to provide a wafer for further processing back into track system 20', and when track system 20' is ready to receive such wafer for further processing.

The interplay between Table 1, FIGS. 4A–4F, and FIGS. 3A and 3B will now be described. Let us arbitrarily begin with wafer 4, which is the fourth wafer from the bottom in FIG. 3A. From the legend on the right portion of FIG. 3A we see that wafer 4 is completing its 49.0 second time in the CTx (coater module), some of the 49.0 seconds being to the left of FIG. 3A, e.g., not shown. The associated data appears in FIG. 4B, fourth row from top (e.g., data for wafer 4), column 26, CTx. Immediately after the CTX station, there is a 28.5 wait time, shown in FIG. 3A as a white bar commencing at about time 640 seconds, and denoted wait 6 in FIG. 4C, column 27, fourth row. Note in FIG. 4C, no insertion delay (as opposed to a "wait") is required, according to the present invention. Still looking at wafer 4 in FIG. 3A, after 28.5 seconds of wait time has expired (at approximately 670 seconds along the time axis), the CTR-230 robot moves the wafer over a 5.5 second transport time (see Table 1; see FIG. 4C, row 4, column 29).

Figure 4B:
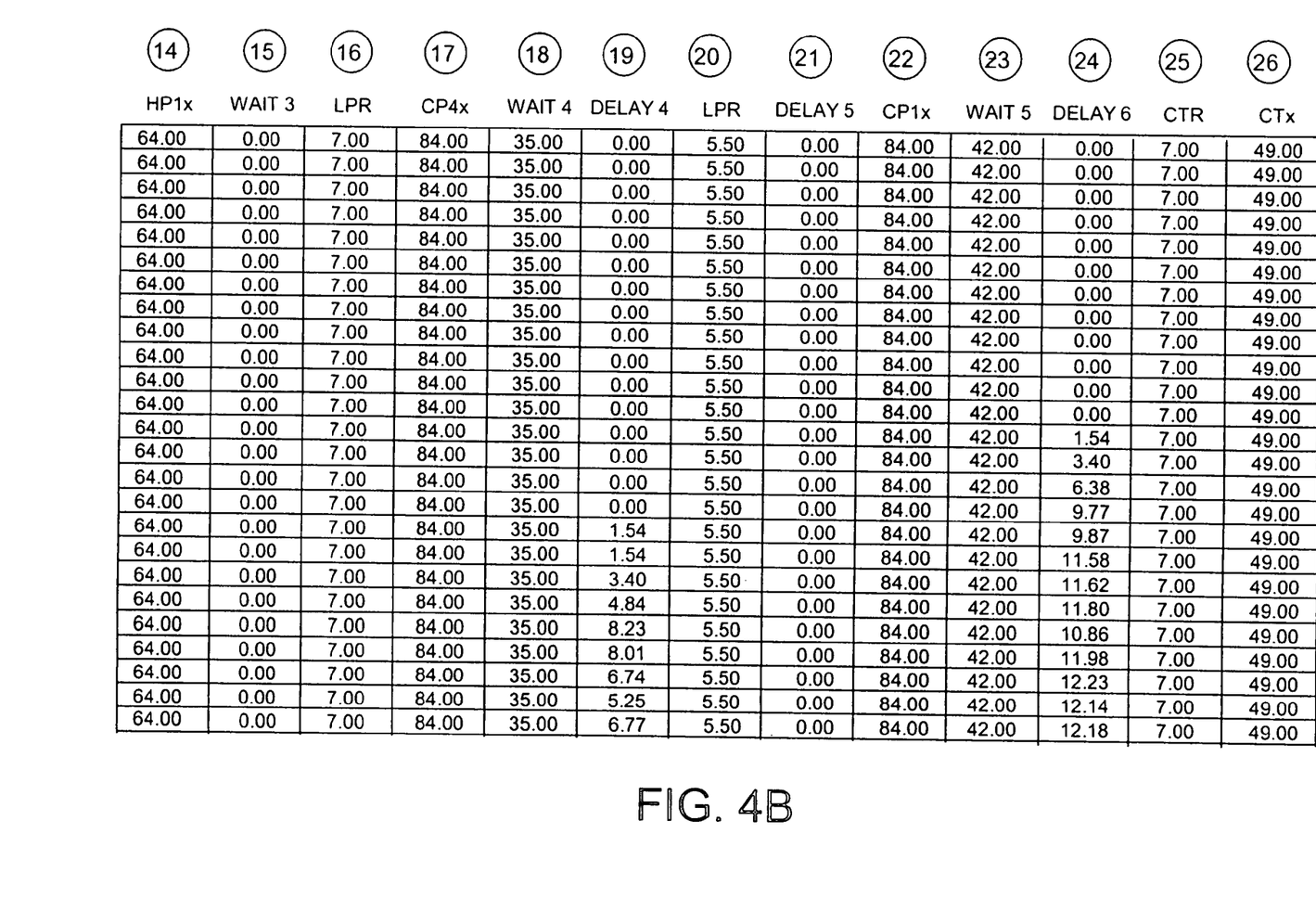
Figure 4C:
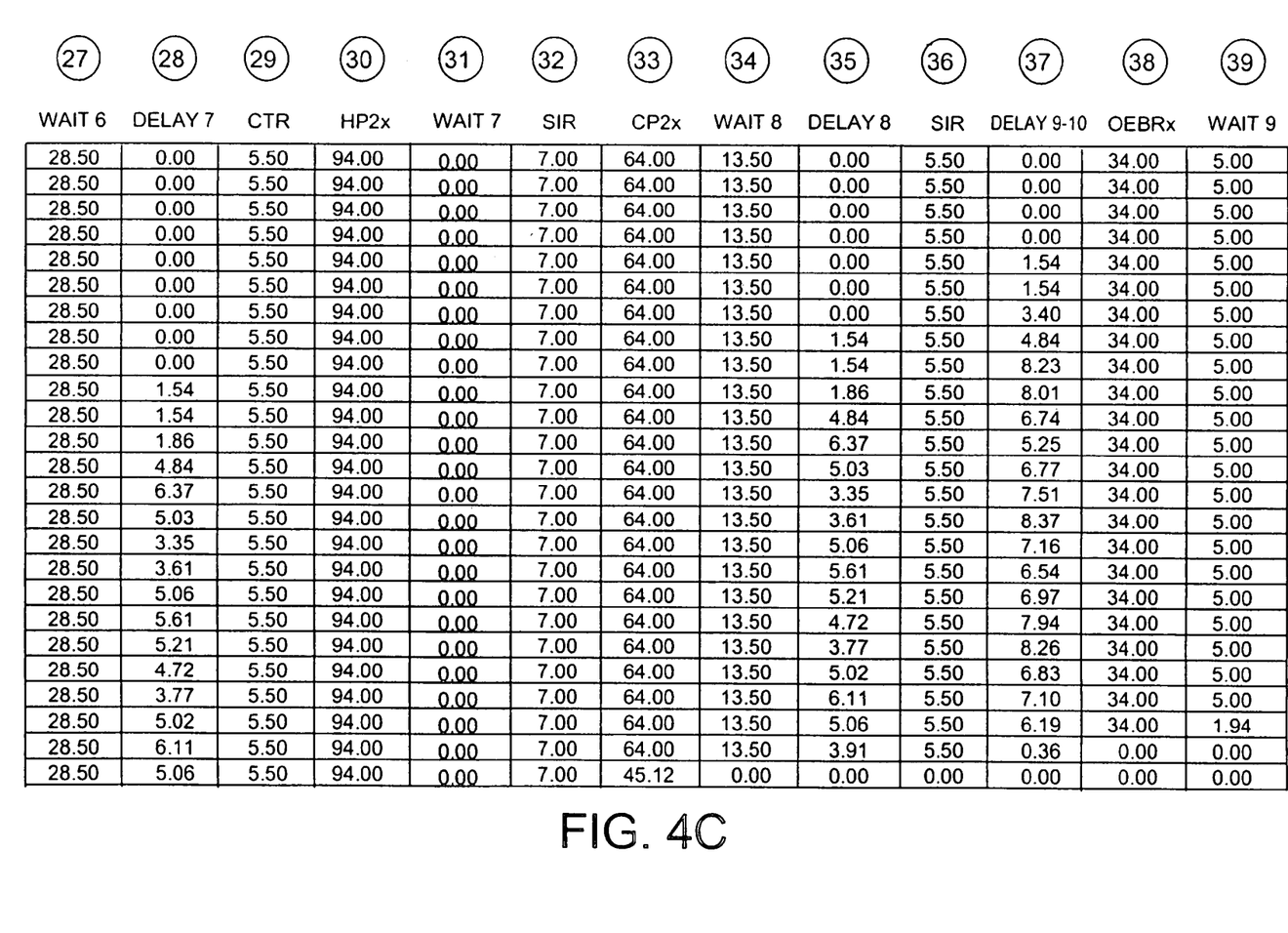

At about time 690 seconds wafer 4 is positioned on a hot plate HP2x for 94.0 seconds (see Table 1 and FIG. 4C, row 4, column 30). The end of the 94.0 second hot plate duration is approximately time 765 for wafer 4 in FIG. 3A. No additional wait, as disclosed in the '356 patent is required, as indicated by FIG. 4C, row 4, column 31, e.g., wait 7 is zero seconds.

Next as shown by the small rectangle in FIG. 3A that follows the relatively long hot plate rectangle symbol, the SIR-230 robotic unit takes wafer 4 for 7.0 seconds, reflecting data in FIG. 4C, at row 4, column 32. At about time 770 seconds, wafer 4 begins 64.0 seconds on cold plate CP2x (see Table 1, and FIG. 4C, row 4, column 33), as indicated by the rectangular bar in FIG. 3A that extends from about time 770 to about time 834. As shown by the white bar in FIG. 3A that follows, an intentional wait of 13.5 seconds is inserted (wait 8 in FIG. 4C, row 4, column 34), again as determined preferably following the disclosure in the '356 patent. FIG. 4C, row 4, column 35 shows that no delay per the present invention is required, e.g., delay 8 is zero. Next, as shown by the small rectangle beginning at about time 895 seconds, the wafer is moved by the SIR-230 robotic unit for about 5.5 seconds. The corresponding data appears in FIG. 4C, row 4, column 36, as well as Table 1.

As shown in FIG. 4C, row 4, column 37, no "delay" is inserted at this time, e.g., delay 9–10 is zero seconds. At about time 860 an OEBRx process step is carried out for 34.0 seconds, per FIG. 4C, row 4, column 38. In FIG. 3A, as shown by the small white rectangle, a wait of 5.0 seconds (wait 9 in FIG. 4C, row 4, column 39) follows. Immediately following is an inserted "delay" of 1.54 seconds, according to the present invention, denoted delay 11 in FIG. 4D, row 4, column 40. This delay is inserted at about time 895 in FIG. 3A. Next follows a robotic movement of wafer 4 with SIR 240 that occupies 8.0 seconds (see Table 1, and FIG. 4D, row 4, column 41). The end of this 8.0 second movement occurs at approximately time 905 seconds in FIG. 3A.

Figure 4D:
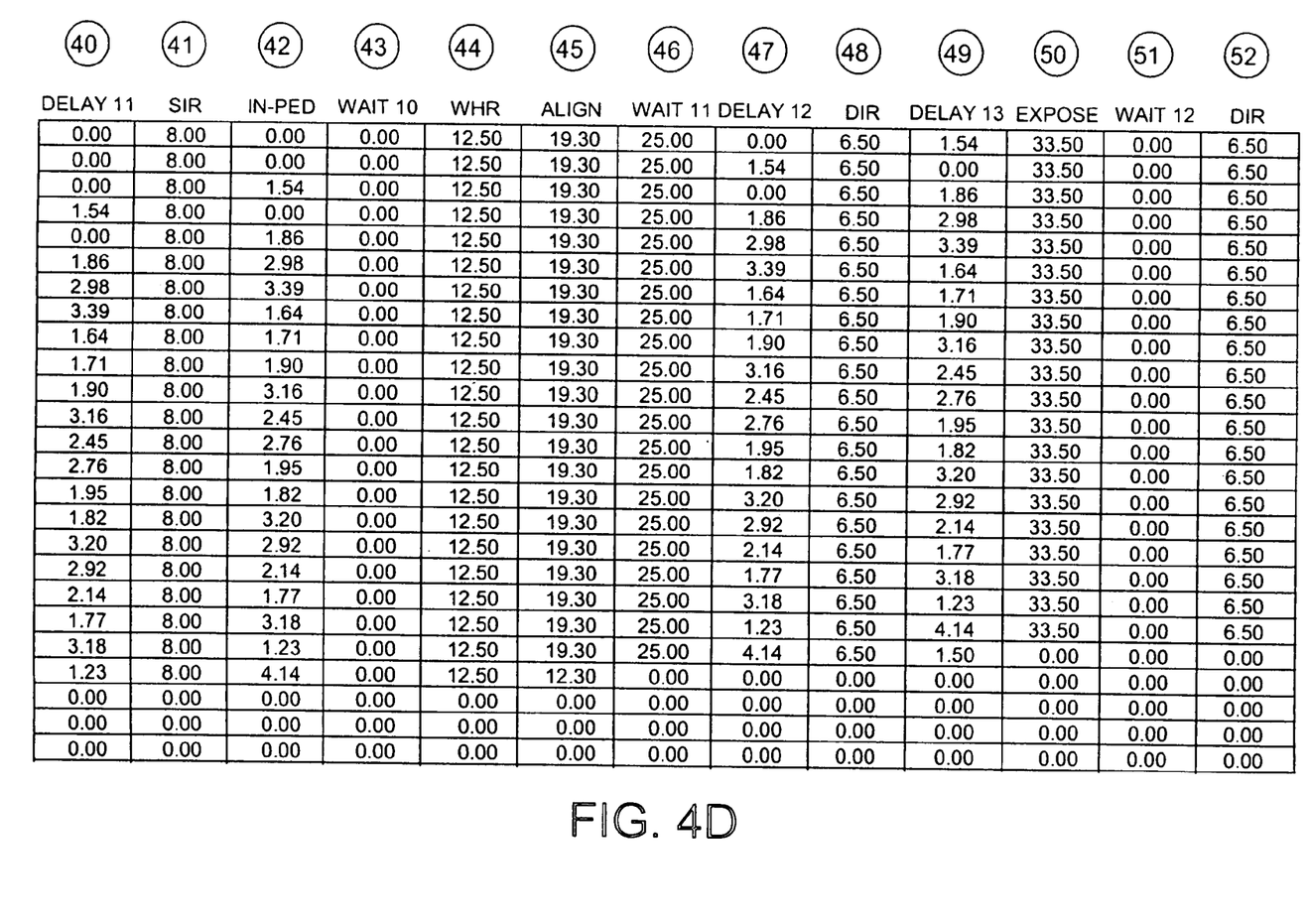

Immediately following, wafer 4 spends zero time on the IN-PED station within scanner system 30' (FIG. 4D, row 4, column 42), and has zero inserted wait (FIG. 4D, row 4, column 43, e.g., wait 10 is zero). Wafer 4 is transported by WHR-240 (or equivalent) for 12.5 seconds (Table 1, FIG. 4D, row 4, column 44), for processing within scanner system 30'. In FIG. 3A, termination of this 12.5 second period occurs just before time 920 on the horizontal axis. From Table 1 and FIG. 4D, row 4, column 45, an alignment step (ALIGN) follows for 19.3 seconds, which is followed in FIG. 3A by a white rectangle indicating a wait time of 25.0 seconds (FIG. 4D, row 4, column 46, denoted wait 11). In FIG. 3A, wait 11 ends just after time 960 seconds.

Thus just after about time 960 in FIG. 3A an intentional delay (delay 12 in FIG. 4D, row 4, column 47) of 1.86 seconds is added, according to the present invention. This delay is depicted as a narrow black rectangle in FIG. 3A. Next wafer 4 is moved by robotic unit DIR-240 over a 6.5 second transport time (see Table 1 and FIG. 4D, row 4, column 48). At about time 970 there is a delay of 2.98 seconds (FIG. 4D, row 4, column 40). This is the delay in start-up of the exposure step, and it is this deviation or delay in nominal exposure starting time that the present invention compensates for (among other deviations). In FIG. 3A, exposure does not start until about time 975 seconds, and lasts for 33.5 seconds (see EXPOSE, FIG. 4D, row 4, column 50), exposure shown as a solid rectangle that extends to about time 1008 seconds. No wait state is permitted after exposure (wait 12 is zero seconds in FIG. 4D, row 4, column 51).

Over a transport time of 6.5 seconds (see Table 1 and FIG. 4D, row 4, column 52), robotic unit DIR-240 moves wafer 4 to the discharge station (DISCHRG in FIG. 4E, row 4, column 53) for 1.0 second. No wait state is inserted (e.g., wait 13 is zero seconds per FIG. 4E, row 4, column 54). At about time 1015, robotic unit WHR-240 moves wafer 4 over a 12.4 second transport time (Table 1 and FIG. 4E, row 4, column 55) to the OUT-PED station in scanner system 30'. Per FIG. 4E, row 4, column 56, wafer 4 spends 1.0 seconds at this station, and is then moved by robotic unit SIR-230 with its 9.5 second transport time to hot plate HP3x, e.g., post-exposure bake module 90 in FIG. 2. Note from FIG. 4E, row 4, columns 57 and 58, that no wait time and no delay time is inserted (e.g., wait 14 is zero seconds, and delay 17 is zero seconds). The 9.5 second SIR-240 transport time is reflected in Table 1, and FIG. 4E, row 4, column 59.

Figure 4E:
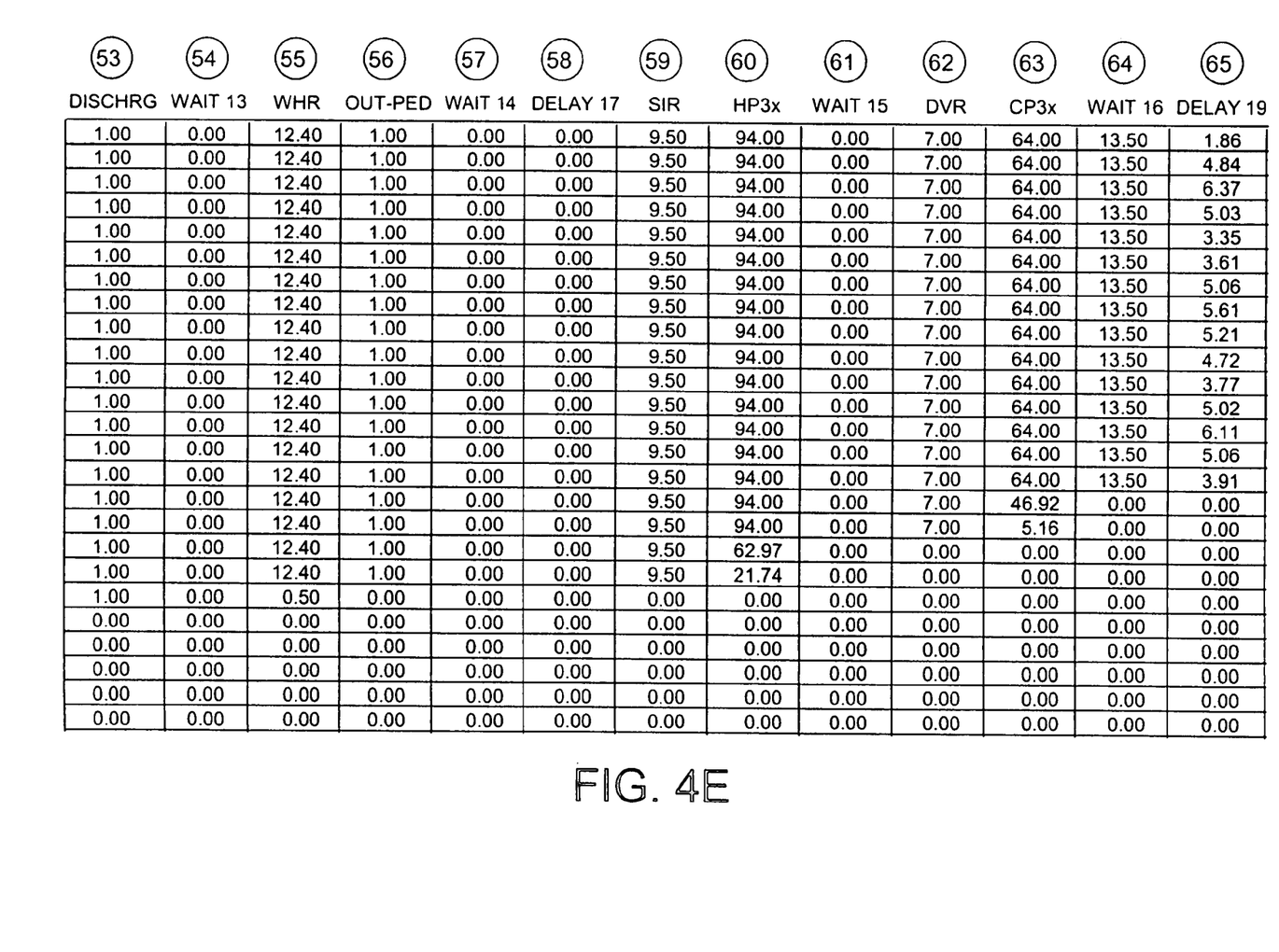

As shown graphically in FIG. 3A by the hatched rectangle spanning from just before time 1040 through about time 1130, wafer 4 next remains on hot plate HP3x for 94.0 seconds (see Table 1 and FIG. 4E, row 4, column 60). No wait state is permitted after the post-exposure bake (e.g., FIG. 4E, row 4, column 61 shows wait 15 is zero seconds). Wafer 4 is immediately picked up by robotic unit DVR-230 and transported (with a 7 second transport time) to chill plate CP3x, e.g., module 100 in FIG. 2, for 64 seconds (see Table 1 and FIG. 4E, row 4, column 63). This 64 second wafer 4 cooling step commences in FIG. 3A at about time 1140 and extends off FIG. 3A to be terminated at the left edge of FIG. 3B, just after time 1200 seconds.

The white rectangle in FIG. 3B extending to about time 1215 seconds represents an inserted wait of 13.5 seconds (wait 16, FIG. 4E, row 4, column 64). Next follows an inserted delay of 5.03 seconds, according to the present invention, denoted delay 19 in FIG. 4E, row 4, column 65, and depicted as a dark rectangle in FIG. 3B, ending at about time 1220.

Figure 4F:
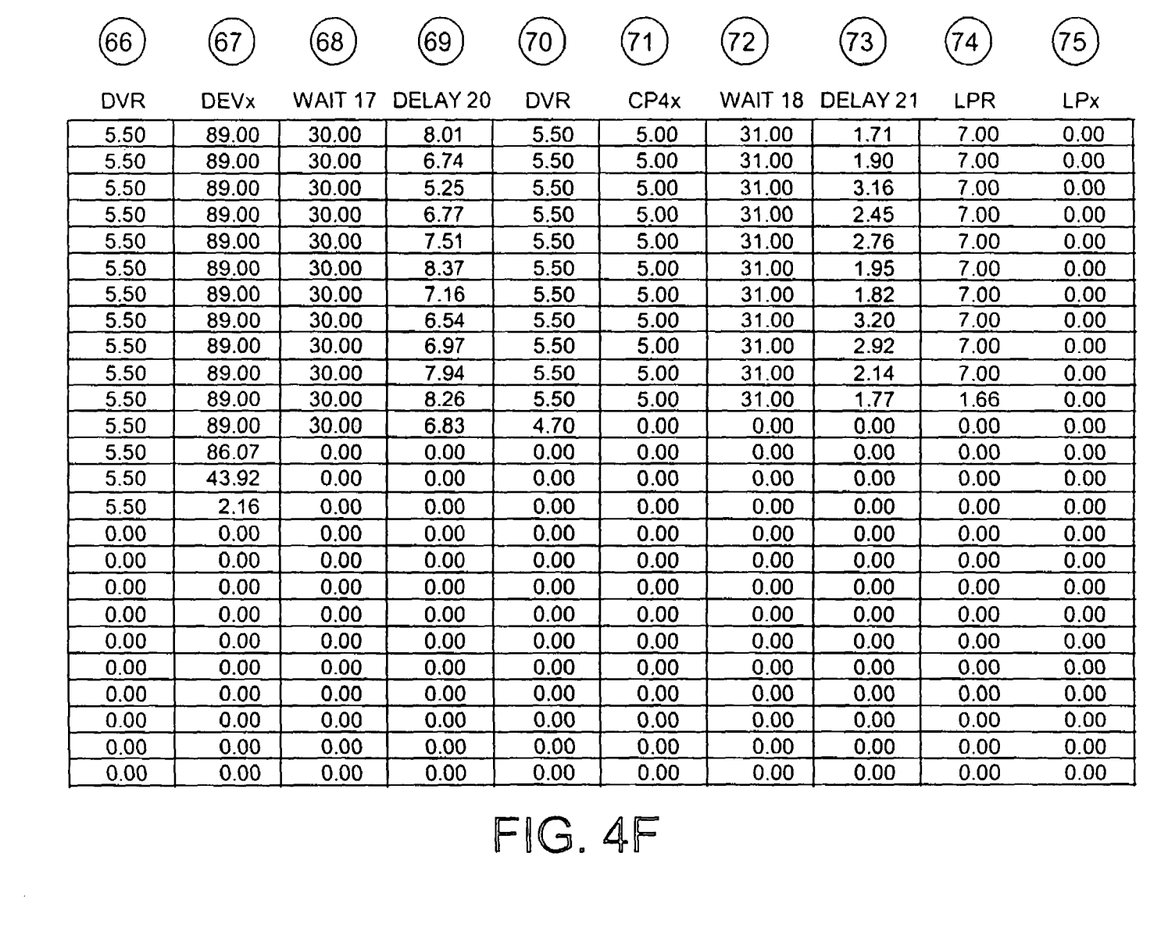

As suggested by FIG. 2, wafer 4 is next conveyed by robotic unit DVR-230 (with its 5.5 second transport time) to developer module 110 (or equivalent), for an 89.0 second development (see Table 1 and FIG. 4F, row 4, column 67).

This lengthy development process is shown in FIG. 3B as the long rectangle extending from about time 1220 to about time 1319 seconds. Looking at FIG. 4F, row 4, columns 68 and 69, wafer 4 is subjected to a 30.0 second wait (wait 17) and a 6.77 inserted delay (delay 20) before being transported by robotic unit DVR-230. After the robotic transport time of 5.5 seconds (see Table 1 and FIG. 4F, row 4, column 70), wafer 4 is presented to a chill plate, e.g., module 50 (or equivalent) in FIG. 2, for 5.0 seconds (Table 1 and FIG. 4F, row 4, column 71). Again it is noted that FIG. 2 is generic and not every module depicted is necessarily reflected in the wafer recipe being described.

Wafer 4 is nearing the completion of processing. Per FIG. 4F, row 4, columns 72 and 73, wafer 4 undergoes a 31.0 second wait (wait 18), followed by a 2.45 second inserted delay (delay 21). In FIG. 4B, delay 21 terminates shortly before time 1400 seconds. Wafer 4 is then transported by robotic unit LPR-230 (with 7 second transport time) to load port LPx of track system 20'. Wafer 4 is then pushed out of track system 20' slightly after time 1400 in FIG. 3B.

If we examine the other wafers shown in FIGS. 3A and 3B, it is seen that at approximately every 40.0 seconds one of the twenty-five wafers to be processed enters the system flow. As noted in column 2 in FIG. 4A, scanner time deviation from a nominal 40.0 second scanner clock period can vary from a nominal about 0 seconds to about 4.14 seconds. When computer system 210 detects such deviations from nominal scanner system time, an appropriate time delay is inserted into the system flow, as exemplified by FIGS. 4A–4F.

It is the combination of pre-planned "wait states", as disclosed in the '356 patent, plus dynamically inserted "delays", according to the present invention, that promotes the desired synchronous wafer flow throughout scanner system 30' and track system 20', notwithstanding deviations in clock periodicity within scanner system 30'. For example, at about time 1217 seconds, dynamically inserting delays to the movement of wafers 1 and 4 (FIG. 4F, row 1, column 69 and FIG. 4E, row 4, column 65) enables robotic unit DVR-230 to execute pick and placement of wafers 1, 4, and 7 in one continuous single-swap-swap motion.

But for the insertion of these delays, according to the present invention, conflicts in the requests for pick and place by wafers 1, 4, and 7 would exist. Such conflicts would lead to the loss of synchronization of wafer flow across track system 20' and scanner system 30'. Examining FIGS. 3A and 3B vertically along various time instances, it is seen that resource conflicts are avoided as a result of the inserted wait states and time delays, notwithstanding perturbation in scanner periodicity. Determination of delay times, according to the present invention, may be carried out by software 220 using analytical techniques such as those disclosed in U.S. Pat. No. 6,418,356.

Although the exemplary system described assumed a 40 second period, which is to say a production of 90 wafers per minute, it will be appreciated that a faster throughput can also be implemented, for example at least 130 wafers per minute, and preferably 160 wafers per minute.

Modifications and variations may be made to the disclosed embodiments without departing from the subject and spirit of the invention as defined by the following claims.

What is claimed is:

1. In a semiconductor wafer fabrication system that includes at least a track system and a scanner system, a method of compensating the fabrication system for deviations from nominal scanner system clock periodicity, the method comprising the following steps:

(a) operating said scanner system responsive to a signal from a scanner system dock;

(b) operating said track system responsive to a signal from a track system clock;

(c) pre-determining and inserting pre-planned wait states as needed to avoid conflict for resources in said semiconductor wafer fabrication system prior to operating said semiconductor wafer fabrication system; and (d) determining deviation from nominal timing in said scanner clock and dynamically inserting time delay as needed in said semiconductor wafer fabrication system to compensate for such deviation.

2. The method of claim 1, wherein said scanner clock operates with a repetition rate equivalent to at least 90 wafers per hour throughput for said semiconductor wafer fabrication system.

3. The method of claim 1, wherein said scanner clock operates with a repetition rate equivalent to at least 160 wafers per hour throughput for said semiconductor wafer fabrication system.

4. The method of claim 1, wherein location and length of each said time wait at step (c) is determined by a computer system controlling, at least in part, said semiconductor wafer fabrication system.

5. The method of claim 1, wherein said semiconductor wafer fabrication system includes at least two robotic stations.

6. The method of claim 1, wherein said semiconductor wafer fabrication system includes at least three robotic stations.

7. The method of claim 1, wherein said semiconductor wafer fabrication system includes at least four robotic stations.

8. The method of claim 1, wherein step (c) and step (d) are carried out by a computer system.

9. The method of claim 1, wherein said track system operates responsive to a signal from said track system clock and said scanner system operates responsive to a signal from said scanner system clock.

10. A semiconductor wafer fabrication system comprising:
a scanner system operating responsive to a signal from a scanner system clock;
a track system operating responsive to a signal from a track system clock;
means for moving at least one wafer within said semiconductor wafer fabrication system;
means for inserting pre-planned wait states in said single-clock semiconductor wafer fabrication system to reduce conflict for resources in said semiconductor wafer fabrication system; and
means for dynamically inserting time delay as needed in said semiconductor wafer fabrication system to compensate for disturbance in periodicity of said scanner clock.

11. The semiconductor wafer fabrication system of claim 10, wherein said scanner dock operates with a repetition rate equivalent to at least 90 wafers per hour throughput for said semiconductor wafer fabrication system.

12. The semiconductor wafer fabrication system of claim 10, wherein said scanner clock operates with a repetition rate equivalent to at least 160 wafers per hour throughput for said semiconductor wafer fabrication system.

13. The semiconductor wafer fabrication system of claim 10, further including a computer system that controls, at least in part, said semiconductor wafer fabrication system.

14. The semiconductor wafer fabrication system of claim 10, wherein said means for dynamically inserting time delay includes a computer system.

15. The semiconductor wafer fabrication system of claim 14, wherein said computer system generates at least said scanner system clock.

16. The semiconductor wafer fabrication system of claim 10, wherein said means for moving includes at least two robotic stations.

17. The semiconductor wafer fabrication system of claim 10, wherein said means for moving includes at least three robotic stations.

18. For use in operating a semiconductor wafer fabrication system that includes at least a scanner system operating responsive to a signal from a scanner system clock, and a track system operating responsive to a signal from a track system clock, a computer readable medium storing a computer program that when executed carries out at least one of the following steps:

(a) pre-determining and inserting pre-planned wait states as needed to avoid conflict for resources in said semiconductor wafer fabrication system prior to operating said semiconductor wafer fabrication system;

(b) determining deviations from nominal periodicity in said scanner system clock; and (c) calculating and dynamically inserting time delay as needed in said semiconductor wafer fabrication system to compensate for said deviations.

19. The computer readable medium of claim 18, wherein said program when executed statically determines pre-planned wait states to minimize resource conflict within said semiconductor wafer production system.

20. The computer readable medium of claim 18, wherein said program when executed dynamically determines deviations from nominal periodicity in said scanner system clock, and calculates time delay needed to compensate for said deviations.

* * * * *